United States Patent [19]

Bush et al.

[11] 4,121,213
[45] Oct. 17, 1978

[54] RADAR ALTIMETER SIMULATOR

[75] Inventors: Louis W. Bush, Baltimore; Allen R. Cumming, Towson, both of Md.

[73] Assignee: Westinghouse Electric Corp., Pittsburgh, Pa.

[21] Appl. No.: 846,944

[22] Filed: Oct. 31, 1977

[51] Int. Cl.² ............................................. G01S 7/40
[52] U.S. Cl. ................................... 343/17.7; 35/10.4
[58] Field of Search ......................... 343/17.7; 35/10.4

[56] References Cited
U.S. PATENT DOCUMENTS 3,160,882   12/1964   Stimler et al. ..................... 343/17.7

Primary Examiner—T.H. Tubbesing
Attorney, Agent, or Firm—J. B. Hinson

[57] ABSTRACT

An altitude simulator for checking the range accuracy of a radar altimeter is disclosed. Typical altimeters include a transmitter and a receiver. The simulator receives a multipulse trigger signal from the altimeter to be checked. The trigger signal is synchronized with the output pulses of the transmitter. This trigger signal forms an input to a phased locked loop to generate at the output of the phased locked loop a multipulse signal which is synchronized with and phase displaced from the trigger signal by an amount equal to the inherent time delays in the simulator. The output signal of the phase locked loop is coupled to the input of a pulse generator which is programmable to generate a multipulse output signal synchronized with and phase displaced from the output signal of the phase locked loop by a selected fixed amount. A modulator receives an RF input from a signal generator and the ouput signal of the pulse generator to produce at the output of the modulator a pulse modulated RF signal. This pulse modulated RF signal is coupled to the receiver as an input signal and is used to test and calibrate the altimeter.

10 Claims, 5 Drawing Figures

RADAR ALTIMETER SIMULATOR

BACKGROUND OF THE INVENTION

1. Field of the Invention

The invention relates to pulse modulated RF signal sources and more particularly to a pulse modulated RF signal source useful as an altitude simulator to test radar altimeters.

2. Description of the Prior Art

A functional block diagram of a typical prior art altitude simulator for testing radar altimeters is illustrated in FIG. 1.

A typical radar altimeter comprises two basic parts referred to as the transmitter 10 and the receiver 11. The primary purpose of the transmitter 10 is to send out pulses of RF energy via the antenna (not illustrated) which are bounced off the surface of the earth and returns to the receiver 11. The receiver 11 converts the returned RF signal to a pulsed signal and measures the time delay between each of the transmitted pulses and the associated return signals arriving at the receiver 11 and calculates the altitude of the radar altimeter with respect to the earth.

To facilitate testing of the system, a typical transmitter 10 will provide a pulsed trigger signal synchronized in frequency and phase coherent with the transmitted pulses of RF energy. To test the radar altimeter, this pulsed trigger signal is coupled to a range simulator 12 via a cable 13. The range simulator 12 includes a plurality of delay lines, labeled #1 through #n, with typical delay lines functionally illustrated at reference numerals 15, 16 and 17. The pulsed trigger signal from the transmitter 10 is coupled to the input of one of these delay lines by closing one of three switches 20, 21 and 22. Assuming that the switch illustrated at reference numeral 20 is the closed position and the other two switches 21 and 22 are open, the pulsed trigger signal from the transmitter 10 will be coupled to the input of the first delay line 15. The output terminals of delay lines #1 through #n are selectively coupled to the input of a return cable 25 by closing either one of three output switches 26, 27 and 28. Since for purposes of illustration, the first switch illustrated at reference numeral 20 is assumed to be closed coupling the trigger signal to the input of the first delay line 15, it is necessary to close the output switch 26 connecting the output terminal of the first delay line 15 to the return cable 25. Closing the switch 26 couples the output of the first delay line 15 to the input of the return cable 25 to produce at the input to the receiver 11 a pulsed signal which is delayed from the trigger signal from the transmitter 10 by the transmission delay of the first delay line 15 and its associated cables and switch circuits. The receiver utilizes this signal instead of the pulsed signal generated from the returned RF signals. If the first delay line 15 has been carefully measured, this delay can be correlated with a particular altitude to check the performance of the radar altimeter calibration at one specific altitude. Similarly, delay lines #2 through #n can be used to check the radar altimeter calibration at other selected altitudes.

The prior art simulator has several functional limitations. First, each of the delay lines must be carefully cut to simulate accurately one altitude. Thus, if it is desired to change the test altitude, the simulator must be physically modified. Perhaps even more serious is the limitation that for low altitude simulation, a large portion of the delay is in the cables and switching portions of the simulator. This can make calibration of the simulator, especially for low altitude altimeters extremely difficult.

SUMMARY OF THE INVENTION

The simulator disclosed by this application utilizes a phase locked loop which receives as an input a pulsed trigger signal from the altimeter to be tested and generates as an output a pulsed signal with each pulse of this signal displaced from a pulse of the trigger signal by a time interval equal to the inherent delays of the simulator. A programmable pulse generator receives as an input signal the output signal of the phase locked loop to generate a pulsed signal. This signal and an RF signal are coupled to a modulator circuit to generate at the output of the modulator a pulse modulated RF signal which is coupled to the receiver. The phase locked loop is calibrated such that the delay between the pulses of the pulsed trigger signal and the pulses of the RF signal arriving at the receiver is determined solely by the period of the programmable delay. Each specific programmed delay is equivalent to a specific altitude. This permits any desired altitude to be simulated by changing the period of the programmed delay.

DETAILED DESCRIPTION

Figure 1:
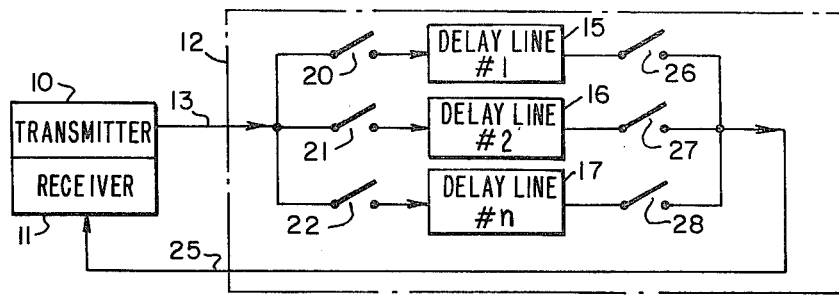
FIG. 1 is a functional block diagram of a prior art simulator.
Figure 2:
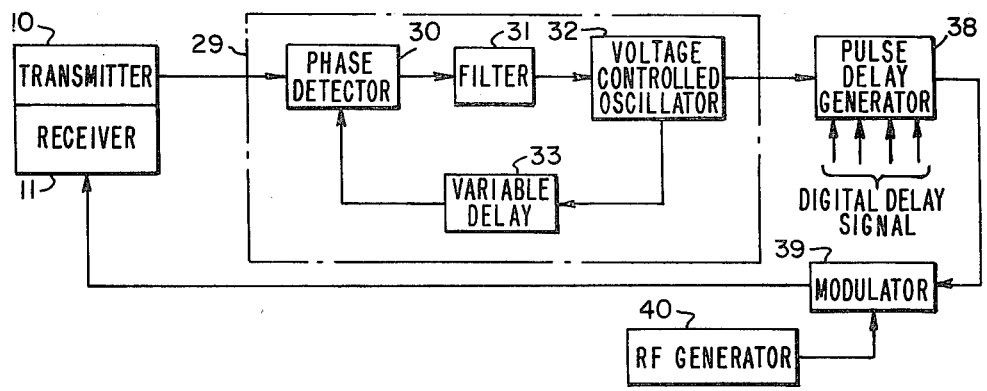
FIG. 2 is a function block diagram of the invention.

The simulator which is the subject of this invention utilizes a phase locked loop 29. The phase locked loop 29 comprises a phase detector 30, a filter 31, a voltage control oscillator 32 and a variable delay 33. The pulsed trigger signal from the transmitter 10 and the output signal of the variable delay 33 are coupled to the first and second inputs of phase detector 30. Phase detector 30 generates a DC output signal which varies in amplitude depending on the relative phase of the two input signals. This DC signal is filtered by the filter circuit 31 to produce a voltage which is coupled to the frequency control input of voltage controlled oscillator 32 to control the output frequency of this oscillator at the desired value. The output signal of the voltage controlled oscillator 32 is coupled to the input of the variable delay circuit 33. Variable delay circuit 33 is adjusted to generate a delay to equal the inherent delays of the entire range simulator including connecting cables. This results in the production at the output terminal of the voltage controlled oscillator 32 a pulsed signal which is phase displaced from the synchronizing signal from transmitter 10 by a time interval exactly equal to the inherent delays in the entire altimeter simulator circuit.

The output signal of the voltage controlled oscillator 32 is coupled to the input of a pulse delay generator circuit 38. Pulse delay generator circuit 38 also receives a four bit digital delay signal specifying the delay interval of the circuit. Pulse delay generator 38 generates at the output of this circuit a pulsed signal is phase displaced from the input signal to this circuit by a time interval specified by the digital delay signal.

A pulse modulated RF signal is generated at the output of a modulator circuit 39 by coupling the output signals of the pulse delay generator 38 and the RF generator 40 to the input terminals of the modulator 39. A cable couples the pulse modulated RF output signal of the modulator 39 to the receiver 11.

To calibrate the radar altimeter simulator, the digital delay signal input to the pulse delay generator 38 is set to zero. The phase locked loop 29 is allowed to lock and then the variable delay 33 is adjusted such that the pulse modulated RF signal appearing at the input of receiver 11 is precisely in phase with the trigger signal from transmitter 10. This corresponds to a zero altitude indication on the receiver 11. Under these circumstances, the time interval of variable delay 33 is precisely equal to the inherent delays and the simulator circuitry and the cables used to couple this simulator to the radar altimeter. To simulate a particular altitude, it is only necessary to calculate the time interval corresponding to the desired altitude and adjust the digital delay signal to the pulse delay generator 38 such that the output of this circuit is delayed from its input by the specified time interval. This causes each pulse of the pulse modulated RF signal appearing at the input of receiver 11 to be displaced from the pulsed trigger signal to phase detector 30 by a time interval precisely corresponding to the selected altitude. Thus, it is easy to see that the altimeter simulator is quite flexible and permits any specific altitude to be simulated.

Additionally, the time interval corresponding to the simulated altitude is generated by a pulse delay generator 38 which may be digital in nature. The entire delay interval generated by this circuit corresponds to the time interval of the simulated altitude and can thus be adjusted with much greater accuracy than the prior art simulators.

Figure 3:
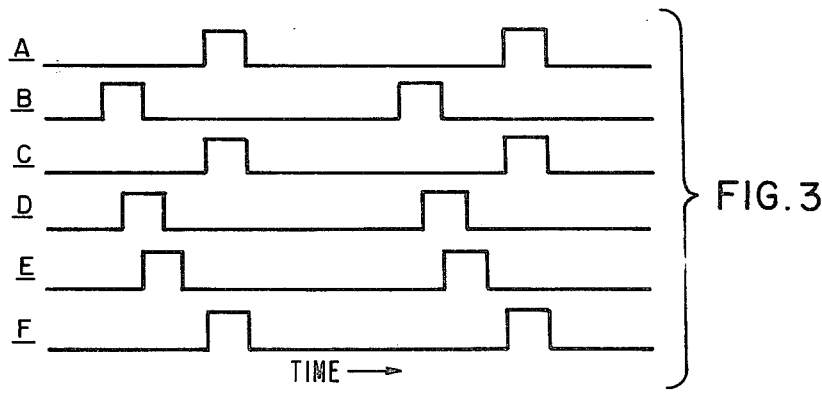
FIGS. 3 and 4 are waveforms illustrating the operation of the simulator for two different altitudes.
Figure 4:
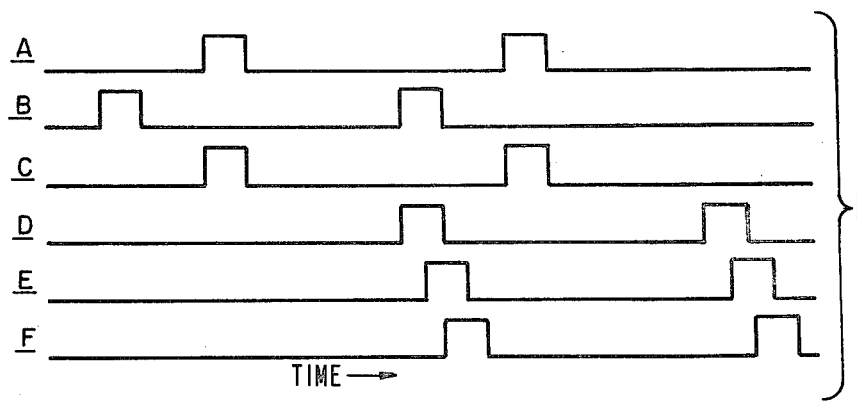

FIGS. 3 and 4 are waveform diagrams for the simulator with FIG. 3 representing the simulation of zero altitude (i.e., digital delay number to pulse delay generator 38 equals zero) and 4 representing some higher arbitrary altitude.

In FIG. 3 the first waveform illustrated in line A is the trigger signal from the transmitter 10. This signal may be either a low level pulsed RF signal or a square wave signal as illustrated. This is a periodic signal with two adjacent pulses illustrated. As previously discussed, this signal is coupled to one input to the phase detector 30. The phase locked loop 29 is allowed to lock to generate at the output of the voltage control oscillator 32 a series of pulses. Once this loop has locked, the output signal of the voltage control oscillator is synchronized with but displaced in phase from the trigger signal. Two adjacent pulses of the output signal of the phase locked loop are illustrated in line B of FIG. 3. This signal is coupled to the input of variable delay 33 to generate a pulsed signal at the output of this circuit as illustrated in line C of FIG. 3. It should be noted that this signal is in exact synchronism with the trigger signal illustrated in line A.

The pulsed output signal of the voltage control oscillator is coupled to the input of the pulse delay generator 38 to generate at the output of this circuit a pulsed signal, illustrated in line D of FIG. 3. The delay between the pulses of the signal illustrated in line B and line D is the inherent delay of the pulse generator 38 because the digital delay number is equal to zero. The output signal of the pulse generator 38, illustrated in line D, and the output signal of an RF generator 40 are coupled as inputs to the modulator 39 to generate at the output of the modulator 39 a pulse modulated RF signal illustrated in line E of FIG. 3. A cable is used to couple the output signal of the modulator to the input of the receiver 10. This signal is illustrated in Line F, FIG. 3. The delay between the signals illustrated in lines D and F is the inherent delays in the modulator 39 and the cable connecting the output of the modulator 39 to the receiver 11. Under the above described conditions it should be noted that the pulses of the RF signal illustrated in line F are in exact synchronism with the trigger signal illustrated in line A and thus simulate a zero altitude.

FIG. 4 is a waveform diagram illustrating the operation of the simulator to simulate an arbitrary altitude greater than zero as represented by a digital delay signal input to pulse generator 38 greater than zero. In FIG. 4, two typical pulses of the trigger signal from the transmitter 10 are illustrated in line A. As discussed previously, the locking of the phase locked loop 29 generates at the output of the voltage controlled oscillator 32, a signal synchronized with the trigger signal from the transmitter 10 but phase displaced therefrom by an amount equal to the inherent circuit delays of the simulator. Two typical pulses of the output signal of the phase locked loop are illustrated in line B of FIG. 4. The output of variable delay 33, illustrated in line C of FIG. 4, is a signal in precise frequency and phase synchronism with the trigger signal illustrated in line A. Thus, it is clear that the phase locked operation is independent of the range simulated as shown by the identity of the pulse diagrams illustrated in lines A, B and C of FIGS. 3 and 4.

The output signal of the voltage control oscillator 32 is coupled as an input to the pulse delay generator 38, as previously described. The digital delay signal coupled to the input of pulse delay 38 is set to simulate the desired altitude to generate at the output of this generator a signal synchronized with but delayed in phase from the trigger signal by the selected amount. Two typical pulses of the output signal of the pulse delay generator 38 are illustrated at line D of FIG. 4. As previously discussed with reference to FIG. 3, the output signal of pulse delay generator 38, illustrated in line D of FIG. 4, and the output signal of the RF signal generator 40 are coupled to the inputs of the modulator 39 to generate at the output of this modulator a pulse modulated RF signal illustrated at line E of FIG. 4. This signal is in turn delayed by the delay time of the cable connecting the output of modulator 39 to the receiver 11 to produce a modulated RF waveform illustrated at line F of 4 at the input of receiver 11. The precise delay time between the leading edge of the pulses of the trigger signal, illustrated in line A, to the leading edge of the pulses of the modulated RF signal, illustrated in line D of FIG. 4, represents the simulated altitude.

Figure 5:
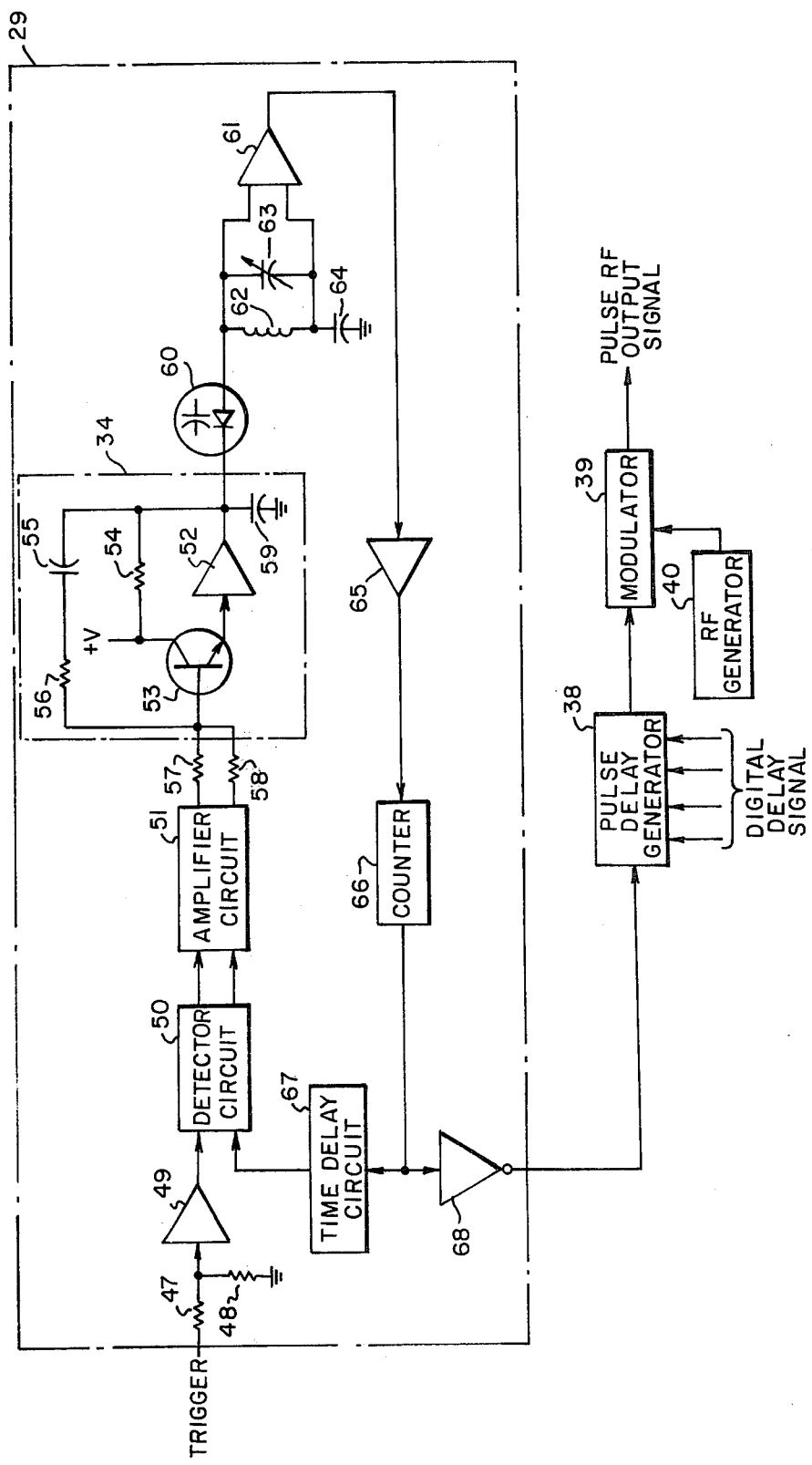
FIG. 5 is a more detailed diagram of the altitude simulator.

FIG. 5 is a more detailed schematic diagram of the simulator. The trigger signal from the transmitter is coupled to a resistor divider network composed of two resistors, 47 and 48. The junction of these two resistors is coupled to the input of an amplifier 49 to produce a squarewave signal at the output of this amplifier having a suitable amplitude for use as an input signal by the phase detector circuit 50.

The output signal of amplifier 49 is coupled to the first input terminal of a phase detector circuit 50. The phase detector circuit 50 has both a positive and a negative current output signal which are combined and amplified in an amplifier circuit 51. The output signals of the amplifier 51 also includes a positive and a negative current which are combined in a resistor network comprising two resistors 57 and 58 to produce an input signal to a filter circuit 34.

For purposes of convenience, an active filter circuit is utilized. This circuit includes an amplifier 52. The signal of the amplifier formed by combining the output signals of amplifier circuit 51 in the resistor network comprising two resistors, 57 and 58, is coupled to the input of the amplifier 52 through an emitter follower comprising a single transistor 53. DC bias is provided to the output stage of the amplifier 52 through a resistor 54. Filtering of the output signal of amplifier 52 is provided by coupling the output terminal of this amplifier directly to ground through a capacitor 59 and by coupling a feedback network between the output and input terminals of amplifier 52 through a transistor 53. This feedback network comprises the series connected combination of a capacitor 55 and a resistor 56. The various components of the filter network are selected to achieve the proper time response characteristics to stabilize the phase locked loop.

The variable DC voltage at the output of amplifier 52 is coupled to the first terminal of a voltage variable capacitor 60. The second terminal of the voltage variable capacitor 60 is coupled to the first input of an amplifier 61 which forms the active element of a voltage controlled oscillator circuit. A network consisting of an inductor 62 and a capacitor 63 connected in parallel is coupled between the positive and negative input terminals of amplifier 61. The negative input terminal of this amplifier is coupled to ground through a bypass capacitor 64. This results in a frequency determining circuit which essentially consists of an inductor 62 connected in parallel with a capacitor 63 and a voltage variable capacitor 60. This circuit oscillates to produce at the output of amplifier 61 a signal whose frequency is determined by these components and the DC output voltage of amplifier 52.

The output signal of amplifier 61 is coupled to the input terminal of an isolation amplifier 65. The output signal of this amplifier is divided by a counter 66 to produce at the output of this counter, a signal having the same frequency as the trigger signal from the transmitter. Counter 66 is not needed when it is convenient to operate the voltage controlled oscillator at the frequency of the trigger signal. The output signal of counter 66 is delayed by a delay circuit 67 to produce at the output of this circuit, a signal which forms the second input to the phase detector 50. This completes the phase locked loop with the phase detector 50 and the filter circuit producing at the output of amplifier 52, a DC voltage which varies the capacitance of voltage variable capacitor 60 to maintain the frequency of the oscillator such that the output of delay circuit 67 is the same frequency as the trigger signal from the transmitter 10 and in phase therewith.

The output signal of counter 66 is coupled to the input terminal of a pulse delay generator 38 through an isolation amplifier 68. A pulse having the delay interval specified by a digital delay signal is generated at the output of the pulse delay generator 38. A modulator 39 receives as input signals the output signal from pulse delay generator 38 and an RF signal from an RF generator 40. This produces at the output of the modulator 39, a pulse modulated RF signal which is delayed from the pulses of the trigger signal by a time interval specified by the digital delay signal to the pulse delay generator 38. This is the signal which is returned to the receiver of the radar altimeter to simulate the desired altitude as previously described.

The simulator described above can be implemented using available circuits and techniques. For example, the detector circuit 50, the amplifier circuit 51 and the filter circuit 34 can be implemented using a Motorola phase detector circuit No. 4344. Motorola Circuit No. 1648 may be utilized as amplifier 61. A Berkeley Nucleonics Corporation pulse generator Model 7040 can be used as the pulse delay generator 38. Modulator 39 and RF generator 40 may respectively be a Hewlett Packard signal generator Model AD8616 and a Crown microwave modulator Model SC 1044D1. The remaining functions can be implemented using conventional circuits and techniques.

What is claimed is:

1. An altitude simulator comprising:
   (a) a phase detector circuit having first and second input terminals and an output terminal, said first terminal being coupled to receive a trigger signal;
   (b) a voltage controlled oscillator circuit having an input terminal and an output terminal, the input terminal of said voltage controlled oscillator circuit being coupled to the output terminal of said phase detector circuit such that the output frequency of said oscillator circuit is a function of the output voltage of said phase detector circuit;
   (c) first delay means having an input and an output terminal, said input terminal being coupled to receive as an input the output signal of said voltage controlled oscillator to generate a signal having the same frequency as the output signal of said voltage controlled oscillator but delayed therefrom by a time interval determined by said first delay means, said delayed signal being coupled to said second input of said phase detector circuit to complete a phase locked loop;
   (d) pulse delay generator means having at least one input terminal and at least one output terminal, said input terminal being coupled to receive as an input signal the output signal of said voltage controlled oscillator and producing at said output terminal a signal having the same frequency as the output signal of said voltage controlled oscillator but delayed therefrom a predetermined time interval;
   (e) a modulator circuit having first and second input terminals and an output terminal, said first and second input terminals being respectively coupled to receive the output signal of said pulse delay generator means and the output signal of an RF generator to produce at said output terminal of said modulator circuit a pulse modulated RF signal.

2. A circuit for producing a pulse modulated RF signal with the pulses of said RF signal displaced in time from a trigger signal by a predetermined time interval, comprising in combination:
   (a) a phase locked loop including variable time delay means for receiving said trigger signal to produce a pulse train displaced in time from said trigger by a first predetermined time interval;
   (b) circuit means coupled to receive said pulse train and an RF signal to produce a pulse modulated RF signal with each pulse by said RF signal being displaced from said trigger signal by a second predetermined time interval.

3. A circuit in accordance with claim 2 wherein said phase locked loop comprises:
   (a) a phase detector;

(b) a voltage controlled oscillator;

(c) with said phase detector being coupled to receive as inputs said trigger signal and the output signal of said oscillator, to produce at the output of said phase detector a signal having a predetermined relationship to the relative phase of said trigger signal to the output signal of said oscillator with said voltage signal being coupled to said oscillator to maintain a selected phase of said trigger signal relative to the output signal of said oscillator.

4. A circuit in accordance with claim 3 wherein said voltage controlled oscillator produces a signal having a frequency higher than the frequency of said trigger signal and wherein said phase locked loop further includes a counter for dividing the frequency of the output signal of said voltage controlled oscillator to produce a signal having a frequency identical to the frequency of said trigger signal.

5. A circuit in accordance with claim 4 wherein said trigger signals and the output signal of said oscillator are pulsed signals and said variable delay time means comprises adjustable delay means between the output of said voltage controlled oscillator and said phase detector to displace the pulses of said output signal from the pulses of said trigger signal by said first predetermined time interval determining by said adjustable delay means.

6. A circuit in accordance with claim 5 wherein said adjustable delay means comprises delay means having said first predetermined time interval substantially equal to the inherent delays of said circuits.

7. A circuit in accordance with claim 6 wherein said voltage controlled oscillator includes a frequency determining circuit including a voltage controlled capacitor coupled to receive the output signal of said phase detector circuit and in response thereto control the frequency of said oscillator at the desired value.

8. A circuit in accordance with claim 7 wherein said circuit means includes:

(a) pulse delay circuit coupled to receive the output signal of said voltage controlled oscillator circuit to produce a delayed pulse signal;

(B) modulator means for receiving as an input signal said delayed pulse signal and an RF signal to produce at the output terminal of said modulator means a pulse modulated RF signal.

9. A circuit in accordance with claim 8 wherein said pulse delay circuit comprises a delay means which is variable.

10. A circuit in accordance with claim 8 wherein said pulse delay circuit comprises a delay means which is variable in response to a digital signal.

* * * * *